(12) United States Patent
Funakoshi et al.

(10) Patent No.: US 7,077,120 B2
(45) Date of Patent: Jul. 18, 2006

(54) SUBSTRATE CUTTING METHOD

(75) Inventors: Akira Funakoshi, Atsugi (JP); Chiori Mochizuki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 33 days.

(21) Appl. No.: 08/801,464

(22) Filed: Feb. 18, 1997

(65) Prior Publication Data
US 2003/0079583 A1 May 1, 2003

(30) Foreign Application Priority Data
Feb. 21, 1996 (JP) .................... 8-033615
Feb. 12, 1997 (JP) .................... 9-027837

(51) Int. Cl.
  *H01L 21/00* (2006.01)
  *B26D 5/00* (2006.01)
(52) U.S. Cl. .................. 125/13.01; 83/56; 83/365; 83/368; 83/821; 438/11; 438/18; 438/462
(58) Field of Classification Search .............. 83/56, 83/72, 365, 368, 455, 821, 13, 565, 879, 83/74
See application file for complete search history.

(56) References Cited

U.S. PATENT DOCUMENTS 3,276,492 A * 10/1966 Kervefors ............. 83/368 X
3,398,620 A * 8/1968 Gautron ................ 83/368 X
3,976,384 A * 8/1976 Matthews et al. .......... 356/431
4,611,517 A * 9/1986 Schmale ................ 83/368 X
5,059,899 A * 10/1991 Farnworth et al. ............ 438/18
5,327,353 A * 7/1994 Nagano ................... 700/167

FOREIGN PATENT DOCUMENTS

EP          0660421          6/1995

* cited by examiner

*Primary Examiner*—Clark F. Dexter
(74) *Attorney, Agent, or Firm*—Fitzpatrick, Cella, Harper & Scinto

(57) ABSTRACT

A method of producing a semiconductor device constructed by arranging a plurality of substrates, on each of which, thin film semiconductor elements two-dimensionally arranged are installed. The method includes the steps of cutting a substrate along at least a slice line provided on the substrate and on a side facing another substrate, which is one of the substrates when the plurality of substrates are arranged, while detecting a misalignment of a cutting position from the slice line and correcting a cutting position, cutting the substrate of a side opposing the slice line without correcting the cutting position, and adjacently arranging the plurality of substrates on substantially a same plane such that the sides having been cut face each other, while correcting the cutting position of the substrates.

10 Claims, 19 Drawing Sheets

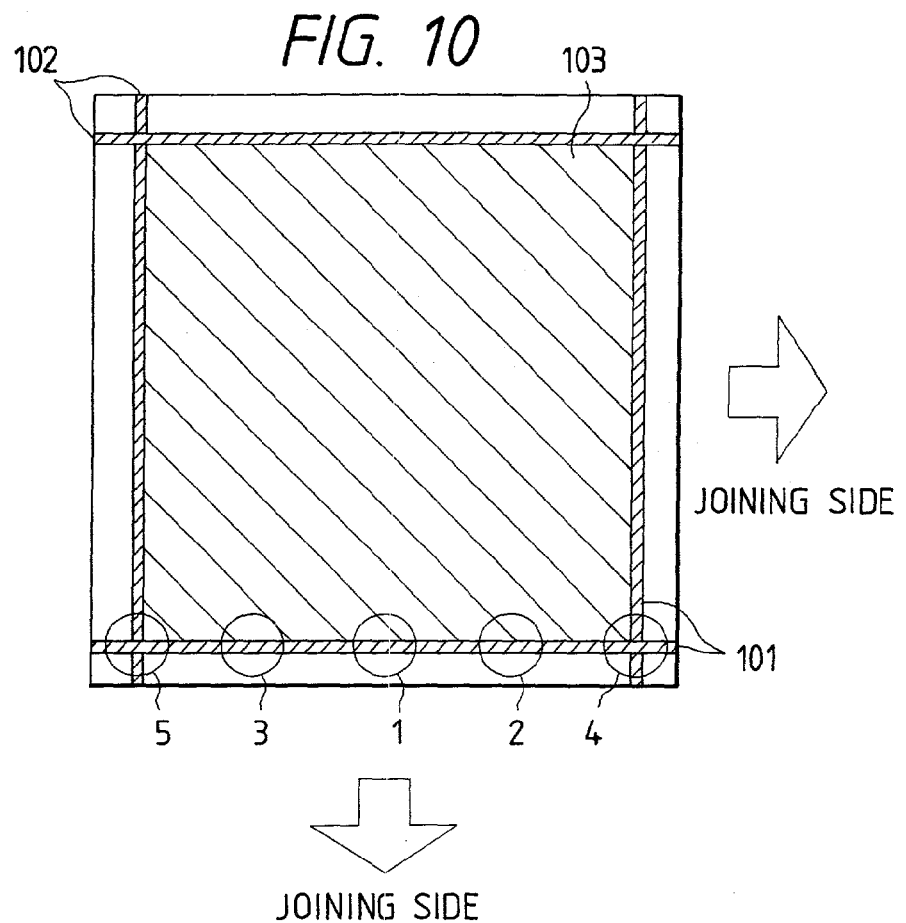
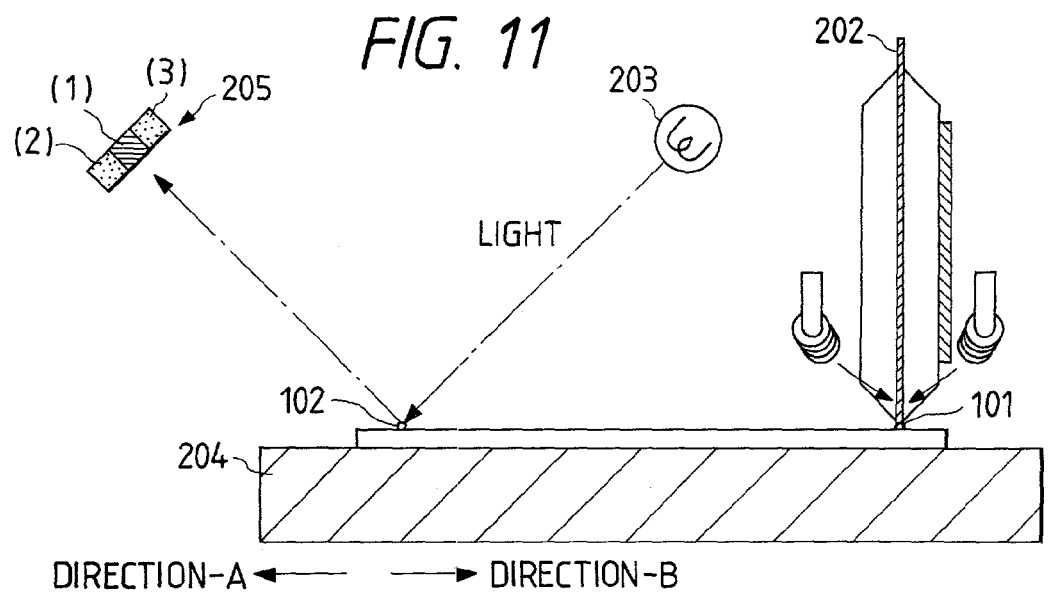

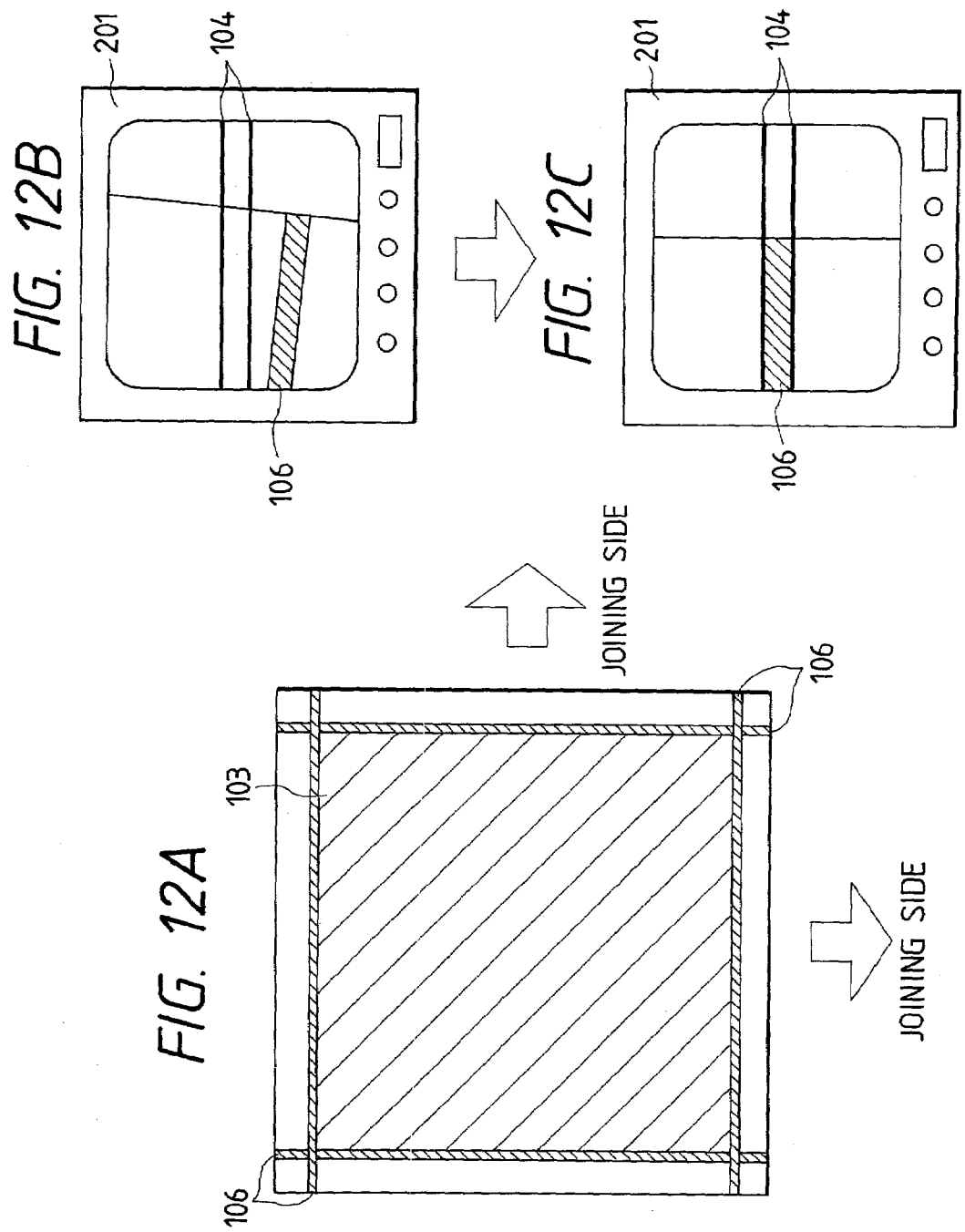

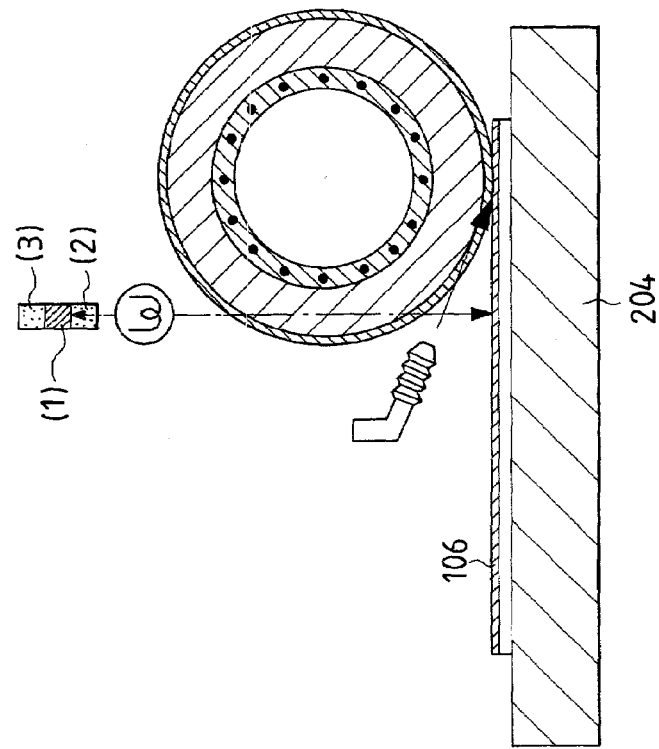
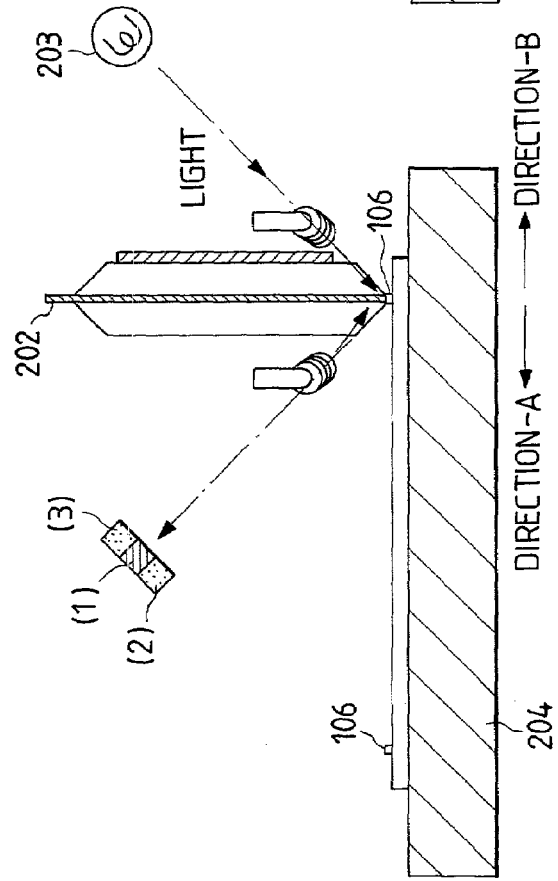

SUBSTRATE CUTTING METHOD

BACKGROUND OF THE INVENTION

1. Field of the Invention

The invention relates to a substrate cutting method and a substrate cutting apparatus. More particularly, for example, the invention relates to a substrate cutting method and a substrate cutting apparatus which are suitably used for cutting a substrate of a thin film semiconductor device constructed by adjacently arranging substantially in a plane a plurality of substrates on each of which thin film semiconductor elements which are two-dimensionally arranged are installed.

2. Related Background Art

A reduction optical system and a CCD type sensor are generally used as a reading system of a facsimile, a digital copying apparatus, an X-ray image pickup apparatus, or the like. In recent years, however, owing to the development of a photoelectric converting semiconductor material represented by amorphous silicon hydride (hereinafter, abbreviated to "a-Si"), what is called a one-dimensional or two-dimensional contact type sensor such that photoelectric converting elements and a signal processing unit are formed on a substrate of a large area and an image is read by an optical system having the same magnification as that of an information source is progressively being developed. Particularly, since a-Si can be used as not only a photoelectric converting material but also a thin film electric field effect type transistor (hereinafter, abbreviated to "TFT"), a-Si has an advantage such that a photoelectric converting semiconductor layer and a semiconductor layer of the TFT can be simultaneously formed.

As an example of a photoelectric converting apparatus having such a contact type sensor, we have proposed an apparatus disclosed in the Official Gazette of European Patent Publication Laid-Open No. 0660421.

FIG. 1 is a schematic overall circuit diagram showing an example of the foregoing photoelectric converting apparatus. FIG. 2A is a schematic plan view for explaining an example of an element which is used as each component element corresponding to one pixel of the above photoelectric converting apparatus. FIG. 2B is a schematic cross-sectional view taken along the line 2B—2B in FIG. 2A.

In FIG. 1, S11 to S33 denote photoelectric converting elements. One electrode side of such an element (for example, a lower electrode side) is shown by G and another electrode side (for example, an upper electrode side) is shown by D. C11 to C33 denote capacitors for accumulation; T11 to T33 TFTs for transfer; Vs a power source for reading out; and Vg a power source for refreshing. The power sources Vs and Vg are respectively connected to the G electrodes of all of the photoelectric converting elements S11 to S33 through switches SWs and SWg. The switch SWs is connected to a refresh control circuit RF through an inverter. The switch SWg is directly connected to the refresh control circuit RF and is controlled so as to be turned on for a refreshing period of time. One pixel is constructed by one photoelectric converting element, a capacitor, and a TFT and its signal output is connected to an integrated circuit IC for detection by a signal wiring SIG.

According to the photoelectric converting apparatus which has been proposed by us before, a total of nine pixels are divided into three blocks and outputs of three pixels per block are simultaneously transferred and are sequentially converted into outputs by the integrated circuit IC for detection through the signal wiring SIG and are generated (Vout). Three pixels in one block are arranged in the lateral direction and three blocks are sequentially vertically arranged, thereby two-dimensionally arranging the pixels.

Although a portion surrounded by a broken line in the diagram is formed on a same insulating substrate of a large area, a schematic plan view of an example of a portion corresponding to the first pixel in such a large area portion is shown in FIG. 2A. A schematic cross-sectional view of a portion taken along a broken line 2B—2B in FIG. 2A is shown in FIG. 2B. As for the photoelectric converting element S11, TFT . . . T11, and accumulating capacitor C11, the elements are not particularly separated but the capacitor C11 is formed by increasing an area of an electrode of the photoelectric converting element S11. Such a structure can be accomplished because the photoelectric converting element and the capacitor has the same layer construction.

A silicon nitride film SiN for passivation and a fluorescent material such as cesium iodide CsI or the like serving as a wavelength converting material are formed in the upper portion of the pixel. In such a structure, when an X-ray enters from the upper position, it is converted into light (shown by a broken line arrow) by the fluorescent material CsI and the light enters the photoelectric converting element. In the photoelectric converting apparatus, as shown in the diagram, nine pixels are two-dimensionally arranged in a form of 3×3. As will be also understood from the diagrams with respect to the driving, an example in which the outputs of the nine pixels are divisionally transferred and generated three times simultaneously for every three pixels is shown. Therefore, by two-dimensionally arranging the pixels as, for example, (5×5) pixels per millimeter in the vertical and lateral directions, an X-ray detector of (40 cm×40 cm) is derived. By combining such an X-ray detector to an X-ray generator in place of an X-ray film and constructing an X-ray Roentgen apparatus, such an apparatus can be used for a nondestructive inspection of a structural material or the like, such as performing a chest Roentgen medical examination, or examining for cancer of the breast. Different from the film, consequently, an output of such an apparatus can be instantaneously displayed by a CRT. Further, the output also can be converted into an output according to an object by converting the output into a digital value and performing image processing by a computer. The output also can be stored onto a magnetooptic disk and a past image also can be instantaneously retrieved. As for a sensitivity as well, a clear image can be obtained by a very weak X-ray in which an influence on the human body is less than that by the film.

FIGS. 3 and 4 are schematic plan views showing embodiments of a photoelectric converting apparatus having (2000× 2000) pixels as examples. In the case of constructing (2000× 2000) detectors, it is sufficient to increase the number of elements in a region surrounded by the broken line shown in FIG. 1 in the vertical and lateral directions. In this case, however, there are 2000 control wirings g1 to g2000 and there are also 2000 signal wirings SIG (sig1 to sig2000). A shift register SR1 and the integrated circuit IC for detection also have to execute 2000 control processes, so that a scale of the apparatus is large.

In a photoelectric converting apparatus of a large area in which the substrate area increases and the number of elements which are formed increases, it is difficult to perfectly eliminate micro dust upon manufacturing, particularly, debris which is peeled off from a wall of a thin film depositing apparatus when an amorphous silicon layer is deposited onto the substrate and dust remaining on the substrate when a metal layer is deposited onto the substrate. There is, consequently, a case where it is not easy to eliminate an inconvenience of the wirings, namely, a short-circuit or an open state of the wirings.

When the control wiring or signal wiring of the photoelectric converting apparatus is short-circuited or opened, there is a case where output signals of all of the photoelectric converting elements connected to such a wiring are inaccurate. In such a case, the apparatus cannot be actually used as a photoelectric converting apparatus. Namely, as one sheet of a substrate when the photoelectric converting apparatus of a large area is manufactured enlarges in size, a probability of the occurrence of the short-circuit or open state per substrate rises. Thus, a yield of the substrate decreases with an increase in size of the substrate and, at the same time, an amount of loss due to an inconvenience per substrate also increases.

To solve the above problems, a method of constructing a larger effective area by adjacently arranging as if in a plane a plurality of substrates on each of which photoelectric converting elements which are two-dimensionally arranged are installed has been proposed.

A proposed structure will now be described with reference to the drawings.

In a photoelectric converting apparatus shown in FIG. 5, it is a characteristic point that four photoelectric converting apparatuses 100, 200, 300, and 400 constructed on four substrates are joined substantially in a plane (adjacently arranged), thereby constructing one large photoelectric converting apparatus.

For instance, (100×100) photoelectric converting elements are arranged on the photoelectric converting apparatus 100 and are connected to a total of 2000 wirings of the 1000 control wirings g1 to g1000 and the 1000 signal wirings sig1 to sig1000. The shift register SR1 is formed in one chip every 100 stages. Ten shift registers SR1-1 to SR1-10 are arranged on the substrate 100 and are connected to the control wirings g1 to g1000.

The integrated circuit for detection is also formed in one chip every 100 processing circuits. Ten integrated circuits IC1 to IC10 are arranged and are connected to the signal wirings sig1 to sig1000. Even in the photoelectric converting apparatuses 200, 300, and 400, in a manner similar to the photoelectric converting apparatus 100, (100×100) photoelectric converting elements are arranged and are connected to 1000 control wirings by 1000 signal wirings. In addition, ten shift registers and ten integrated circuits for detection are arranged, thereby constructing a large photoelectric converting apparatus.

As a method of cutting each substrate of the photoelectric converting apparatuses 100, 200, 300, and 400 so as to obtain design dimensional values, a slice line is formed on the substrate on which the photoelectric converting elements are installed and the slice line is cut, thereby cutting each substrate.

Ordinarily, a cutting apparatus is constructed by a stage to hold the substrate and a blade as a cutting member. The stage can be moved in the X-axis direction (left/right direction on the paper surface) and can be rotated. The blade can be moved in the Y-axis direction (upper/lower direction on the paper surface; the rotation of the blade is parallel with the X direction). Thus, four sides of the substrate can be cut. Specifically speaking, the blade is moved in the Y-axis direction to the cutting position. The stage is rotated and a rotary axis is fixed in a manner such that the slice line which is used as an alignment mark displayed on the monitor screen through a camera fixed to a blade unit is parallel with the slice direction, namely, a stage moving direction. After that, the stage and blade are moved to a cutting start position and the blade is dropped onto the substrate, thereby starting the cutting operation. The cutting is executed by mechanically moving the stage in the X direction. After four sides were cut as mentioned above, four substrates are combined and joined substantially in a plane onto the substrate so as to form a gap between the adjacent substrates, thereby forming the photoelectric converting apparatus of a large area.

According to the photoelectric converting apparatus with the above construction, by improving a yield per substrate upon manufacturing, costs of the substrate are reduced, so that the costs of the photoelectric converting apparatus of a large area or in which a plurality of substrates are combined can be reduced.

However, in the foregoing photoelectric converting apparatus of a large area constructed by joining substantially in a plane a plurality of substrates on each of which the photoelectric converting elements which are two-dimensionally arranged are installed, when the cut substrates are arranged, the gap between the substrates is not constant, so that there is a subject to be improved such that there is a case where an image quality of the gap portion of the photoelectric converting apparatus of the large area deteriorates.

FIG. 6A is a schematic plan view showing a positional misalignment or a bending of the cut line 111 at the time of such a substrate cutting. Reference numeral 101 denotes a slice line and 103 indicates a photoelectric converting portion of a unit of one substrate. As shown in FIG. 6A, a state in which a positional misalignment or a bending of the cut line 111 occurs due to a position matching or parallel ejection misalignment or a precision of the apparatus is illustrated.

FIG. 6B is a diagram clearly showing a variation in gaps between the substrates in the case where four substrates (photoelectric converting portions) 103 each having a cutting position misalignment or a bending of the cut line as mentioned above are arranged on a base plate 105. As shown in FIG. 6B, there is a case where a gap occurs between the adjacent substrates upon joining due to a misalignment, a bending, or a warp of the cut surface. Although the conventional apparatus obviously does not have such a large misalignment or bending, it is a fact that there is also a case where a problem occurs from a viewpoint of a size of a pixel.

SUMMARY OF THE INVENTION

It is an object of the invention to provide a substrate cutting method and a substrate cutting apparatus which can perform an accurate cutting operation when a substrate is cut.

Another object of the invention is to provide a substrate cutting method and a substrate cutting apparatus in which when a plurality of substrates are arranged, the substrates can be adhered by making a gap between the substrates constant or reducing or eliminating such a gap.

Still another object of the invention is to provide a substrate cutting method and a substrate cutting apparatus which can improve an image quality in a gap portion between substrates.

Yet another object of the invention is to provide a substrate cutting method of detecting a position of a guide line provided in correspondence to a slice line and cutting a substrate along the slice line while correcting a cutting position.

Yet another object of the invention is to provide a substrate cutting method whereby when a substrate on which a slice line and a guide line are formed is cut along the slice line of the substrate, a misalignment is detected by detecting the guide line upon cutting and the substrate is cut while correcting the misalignment.

Yet another object of the invention is to provide a substrate cutting apparatus comprising: a cutting mechanism; a unit for relatively moving a cutting position of the cutting mechanism for an object to be cut; a unit for detecting a position at a position different from the cutting position; and a unit for adjusting the cutting position on the basis of position information obtained by the position detecting unit.

Yet another object of the invention is to provide a substrate cutting apparatus for cutting a substrate formed with a slice line for cutting the substrate and a guide line for detecting a misalignment upon cutting, comprising: a unit for cutting the slice line; a unit for detecting the misalignment by detecting the guide line upon cutting; and a unit for correcting a misalignment quantity when the misalignment occurs during the cutting.

BRIEF DESCRIPTION OF THE DRAWINGS

FIGS. 8, 10, 12A, 14, 15, 16, 19, and 20 are schematic plan views each for explaining an example of a substrate having a photoelectric converting element of the invention;

FIGS. 9A, 9B, 12B, and 12C are schematic diagrams each for explaining an example of an alignment method;

FIGS. 11, 13A, and 13B are schematic side elevational views each for explaining an example of a cutting apparatus;

DETAILED DESCRIPTION OF THE PREFERRED EMBODIMENTS

According to a substrate cutting method of the invention, a substrate is cut along a slice line, a guide line corresponding to the slice line is formed, a cutting position is detected by the guide line, and the cutting position is corrected.

A substrate cutting apparatus of the invention has a cutting unit and a unit for correcting a cutting position by the cutting unit on the basis of position information detected by a position detecting unit.

The foregoing objects of the invention can be accomplished by the above substrate cutting method and apparatus.

More specifically speaking, side surfaces of the adjacent substrates can be accurately cut and the substrates can be arranged (adhered) substantially as if in a plane while eliminating or reducing a gap between the adjacent substrates.

The invention will now be described hereinbelow with reference to the drawings as necessary.

EMBODIMENT 1

Figure 1:
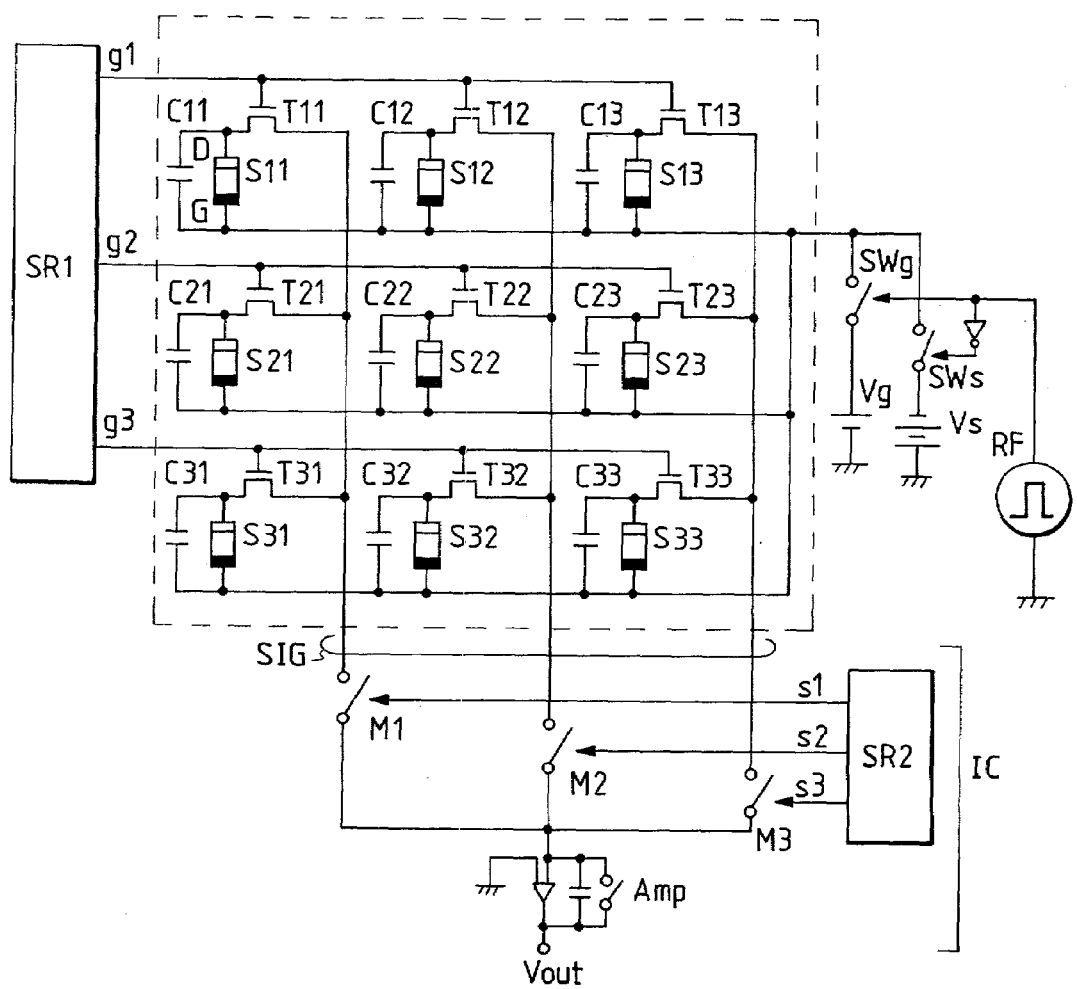
FIG. 1 is a schematic circuit constructional diagram in a whole photoelectric converting apparatus.
Figure 2A:
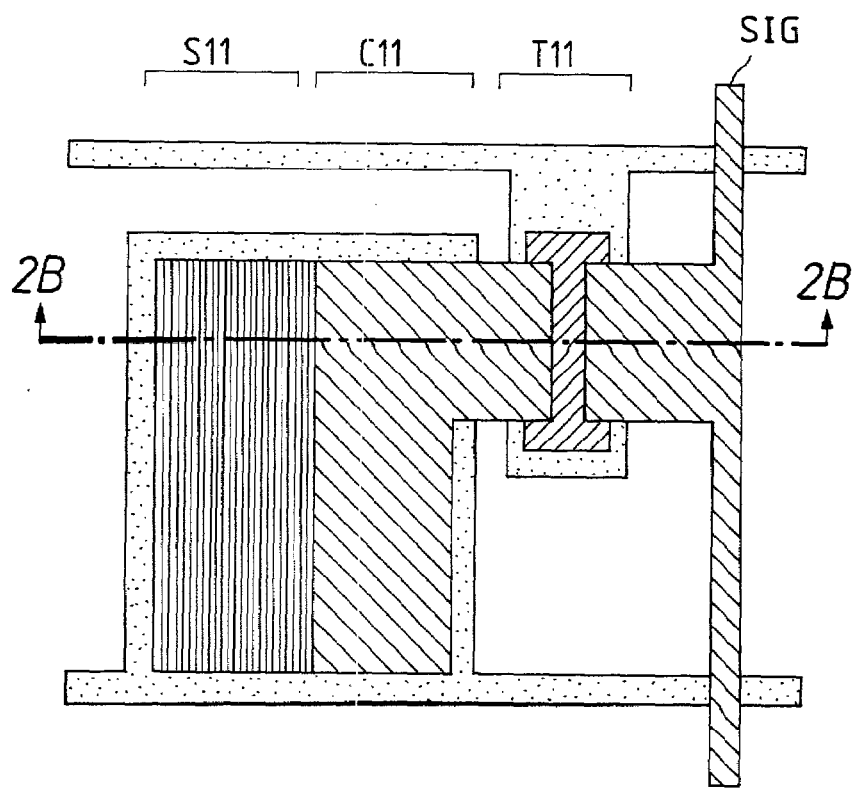
FIG. 2A is a schematic plan view of one pixel of a photoelectric converting element.
Figure 2B:
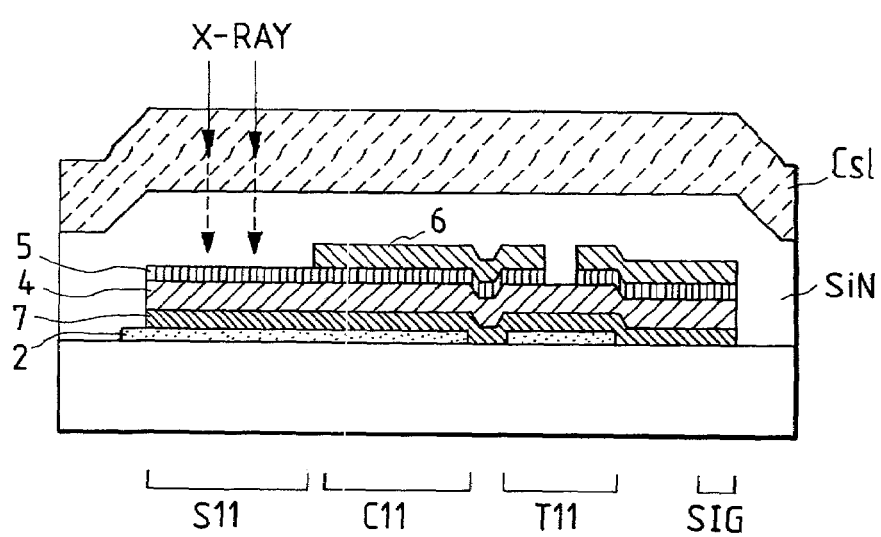
FIG. 2B is a schematic cross-sectional view of one pixel of the photoelectric converting element.
Figure 3:
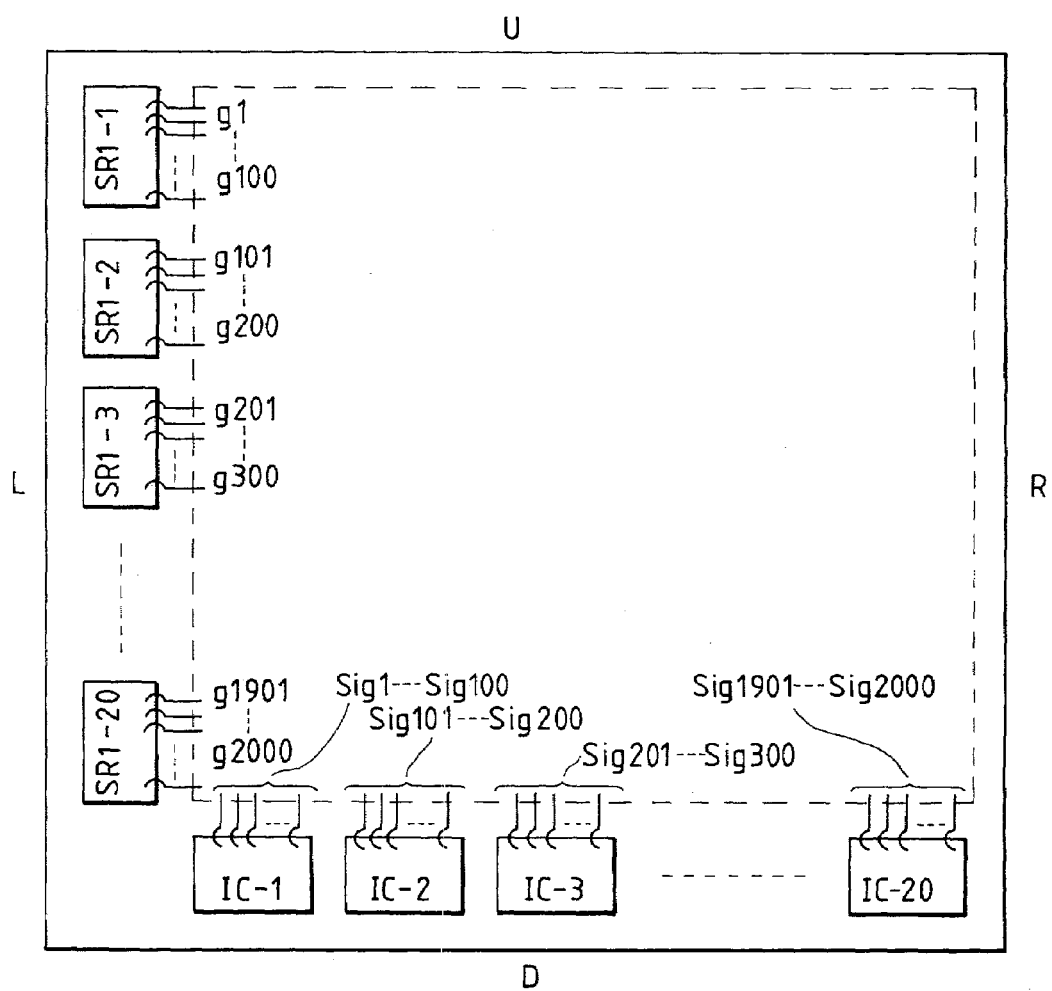
FIGS. 3, 4, and 5 are schematic plan views each for explaining an example of a photoelectric converting apparatus.
Figure 4:
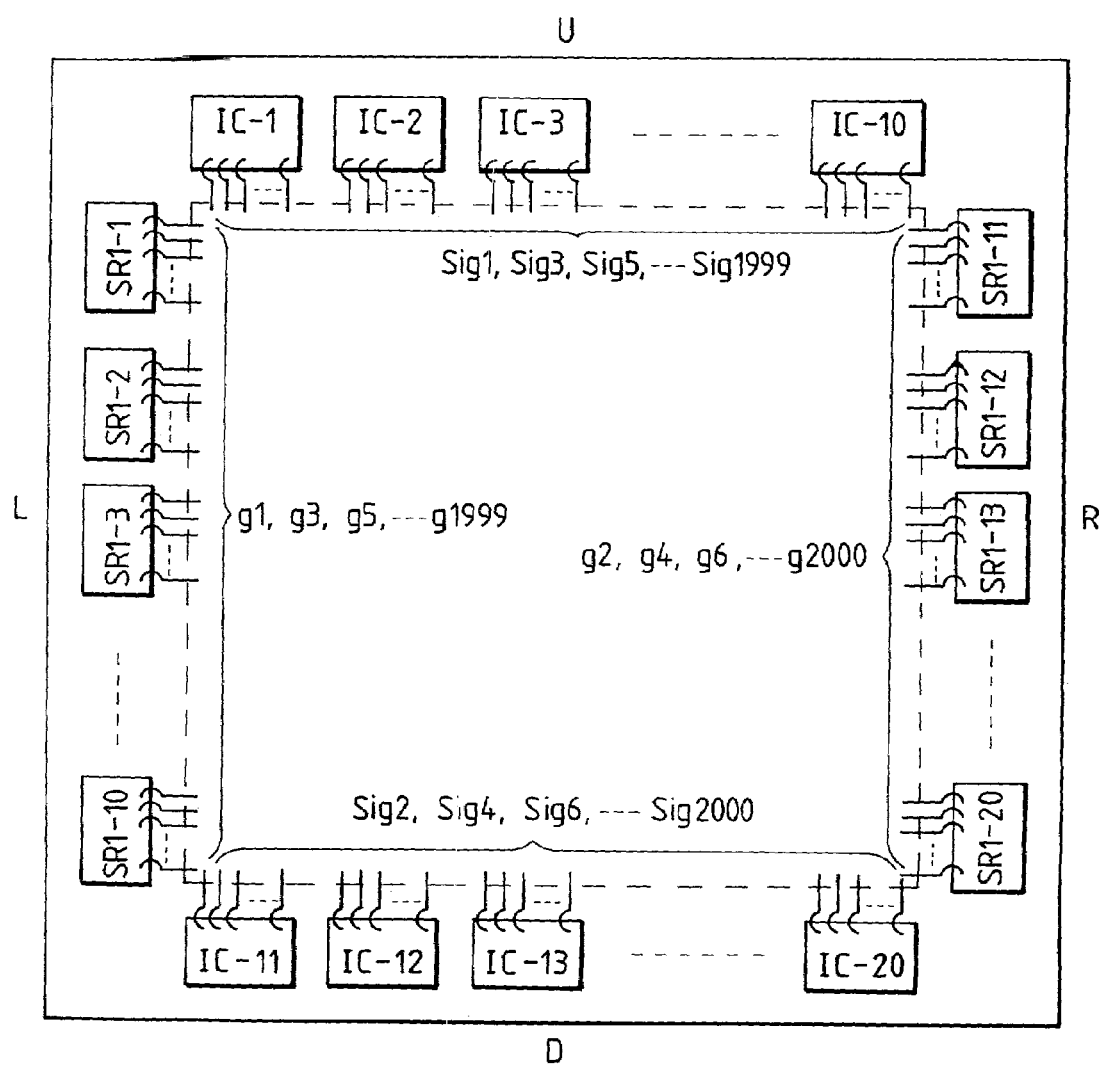
Figure 5:
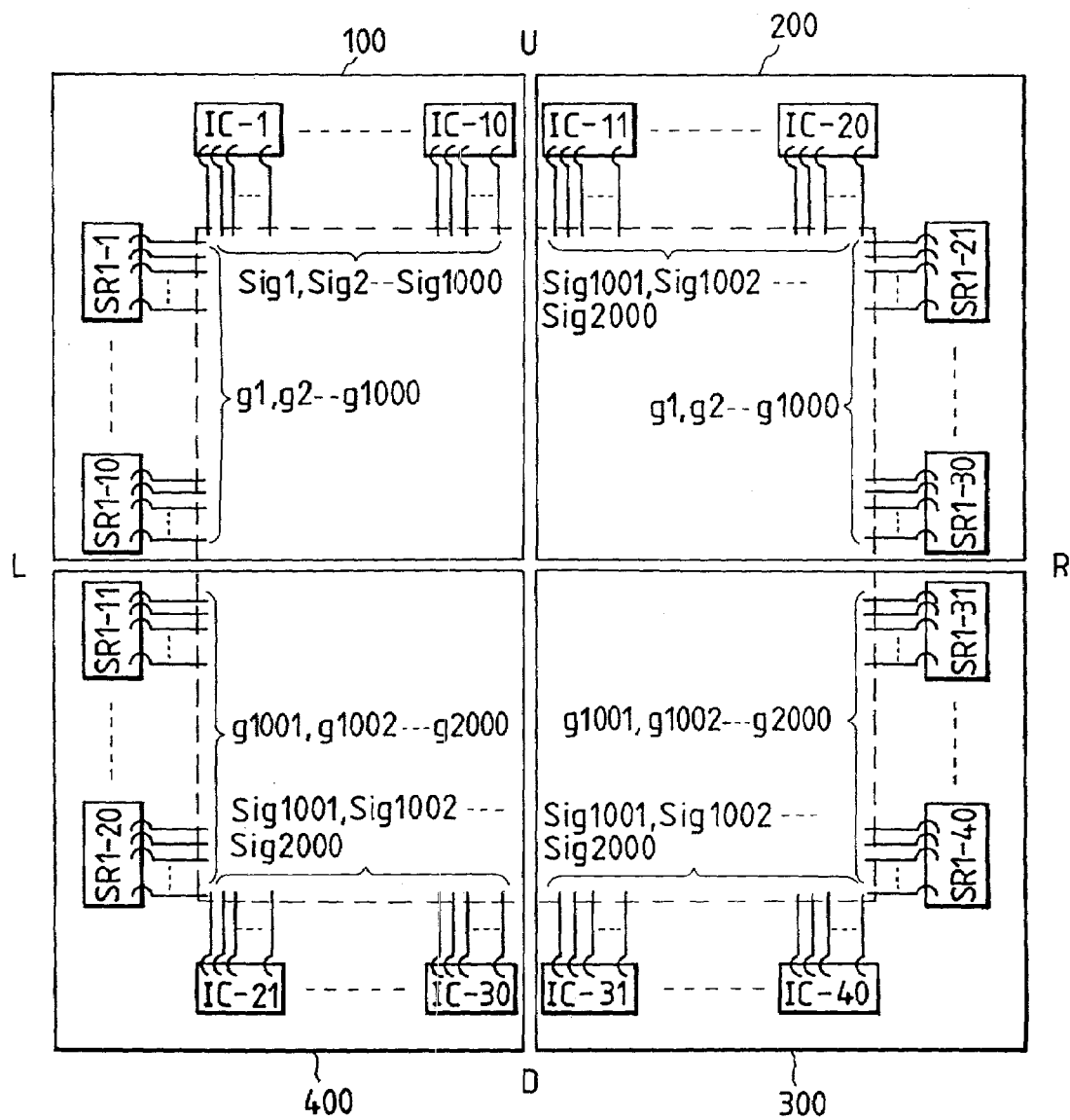
Figure 6:
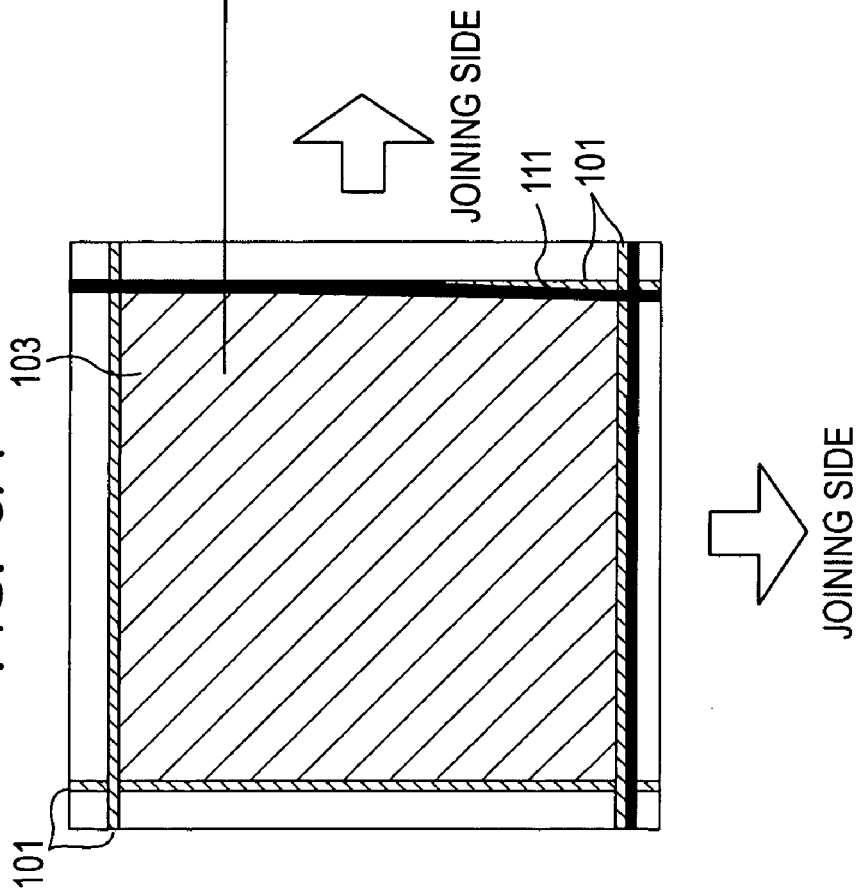
FIG. 6A is a schematic plan view for explaining an example of a cutting of a substrate.
FIG. 6B is a schematic plan view for explaining an example of an arrangement of cut substrates.
Figure 7:
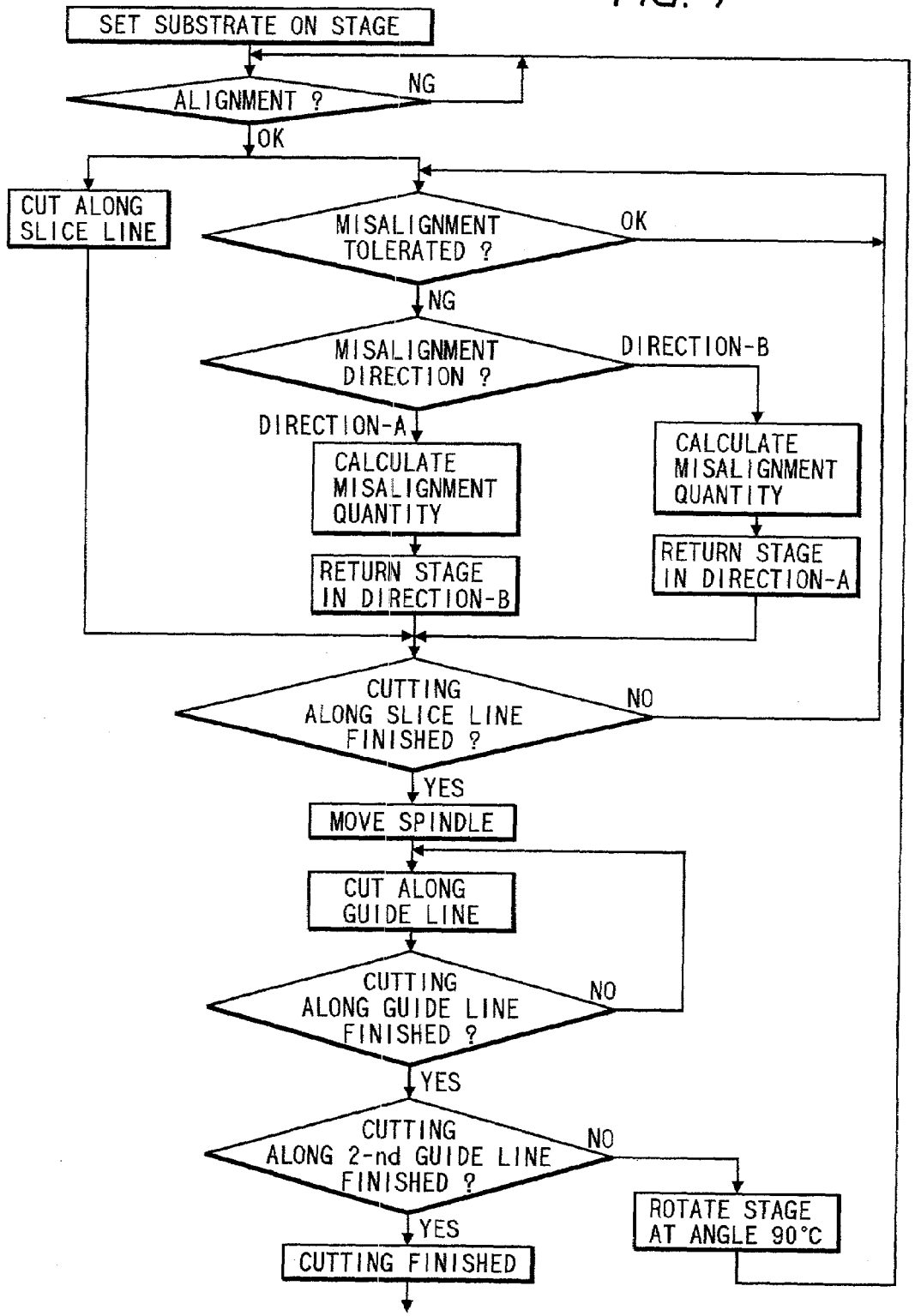
FIG. 7 is a flowchart for explaining an example of cutting in the invention.

A preferred example of the cutting method of the invention will be described further with reference to the drawings in accordance with a processing flow of FIG. 7.

Figure 8:
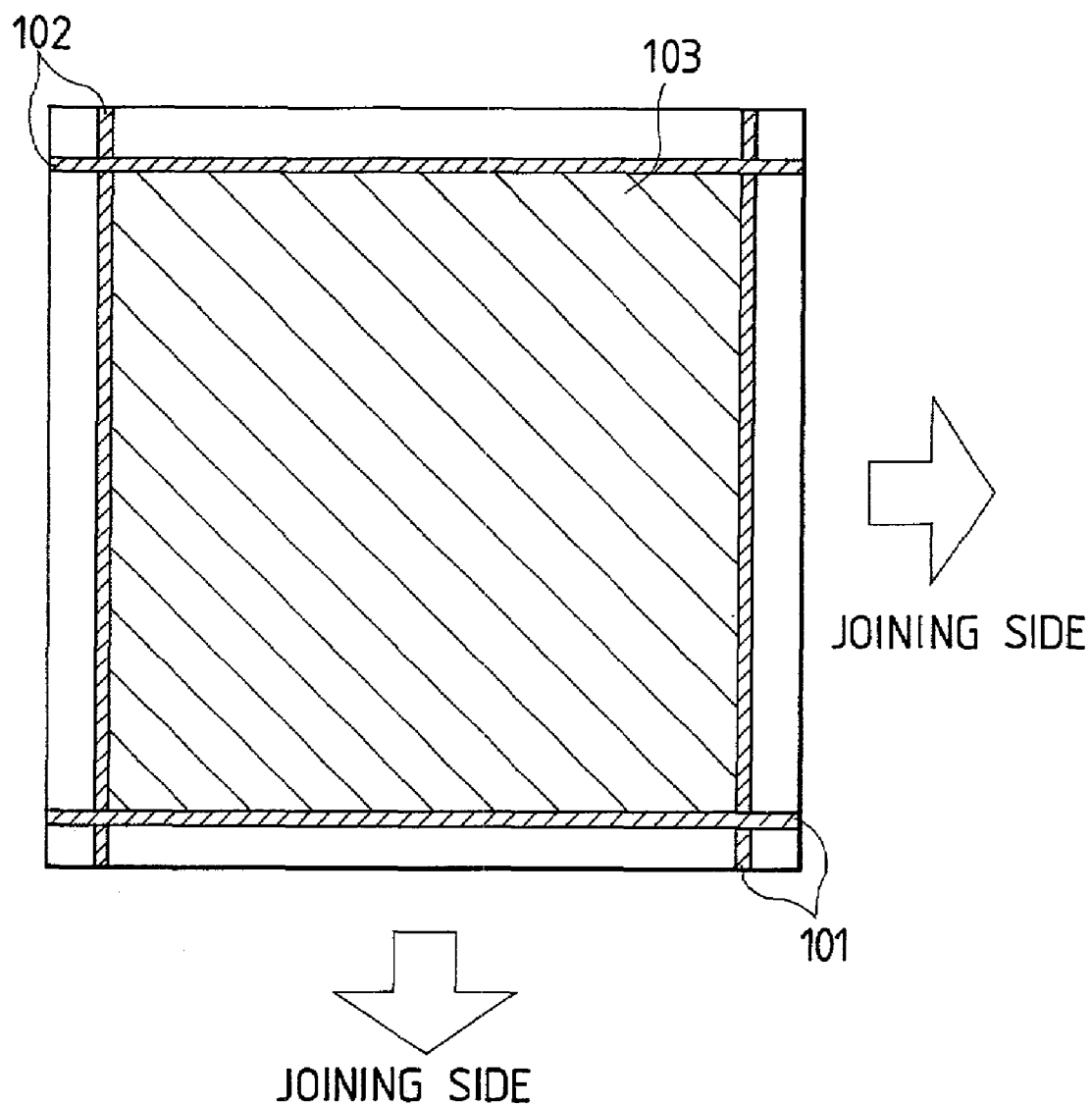

FIG. 8 is a diagram showing the slice line 101 and a guide line 102 provided on the substrate surface. The slice line 101 and guide line 102 are formed by an electrode layer simultaneously formed in parallel with a first or second electrode constructing a TFT or a sensor or by the first or second electrode. Therefore, they can be formed by the same material.

Figure 9A:
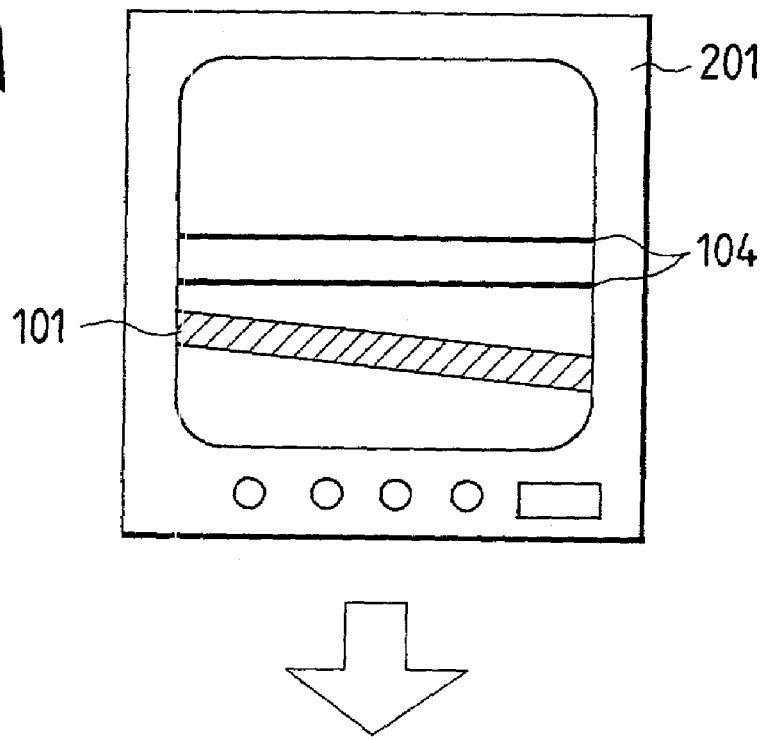
Figure 9B:
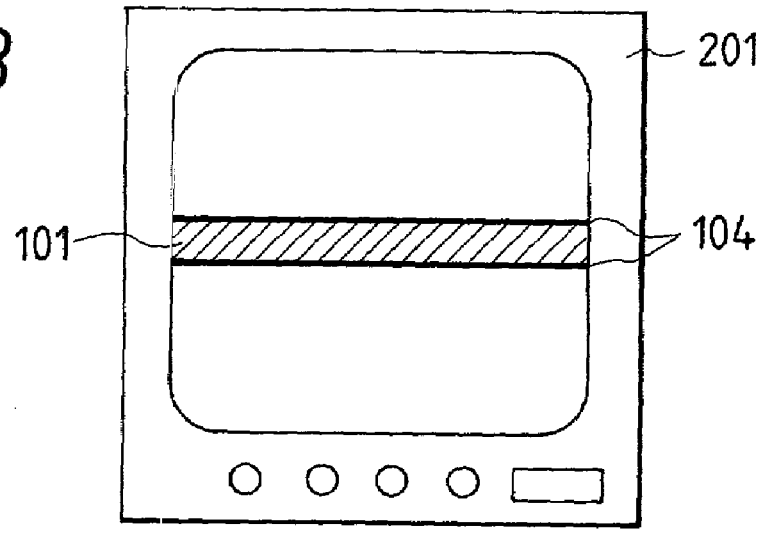

FIGS. 9A and 9B are diagrams when the substrate is set onto a stage 204 (refer to FIG. 11) of the cutting apparatus and the slice line 101 is displayed on a monitor 201 through a CCD camera set in the cutting apparatus. FIG. 9A shows a state in which an alignment is not perfect. In such a case, by moving or rotating the position of the stage 204, the slice line 101 is matched with a scale line 104 on the monitor 201. FIG. 9B shows a state in which the alignment is performed.

FIG. 10 is a plan view of a substrate showing an example of an alignment order. To improve a matching precision and a working efficiency, a matching process is executed from a substrate center portion 1 on the slice line 101 and the alignment position is moved (for example, in accordance with the order of 2→3→4→5), thereby gradually matching the position with the direction of an edge portion of the substrate.

After completion of the matching process, a cutting operation is started. FIG. 11 is a schematic side elevational view for explaining a preferred example of the cutting apparatus. As shown in FIG. 11, a light is irradiated from a light source 203 to the guide line 102. The light is reflected by the guide line 102, thereby confirming the cutting position by a detecting sensor 205. The light source 203 is provided as necessary and an external light can be also used according to circumstances.

For example, when a misalignment of the stage 204 occurs in an A direction in the diagram, a sensor output of sensor portion (1) decreases and a sensor output of sensor portion (2) rises. Therefore, a misalignment movement quantity of the stage 204 is calculated from a difference between those outputs and the stage 204 is moved in a B direction and is returned to the original position. When a misalignment of the stage 204 occurs in the B direction, the sensor output of sensor portion (1) decreases and a sensor output of sensor portion (3) rises, so that a misalignment movement quantity of the stage 204 is calculated from a difference between those outputs and the stage 204 is moved in the A direction and is returned to the original position.

As described above, while the slice line 101 is being cut, the light reflected from the guide line 102 is monitored by the detecting sensor 205.

After the slice line 101 on the substrate is cut, a spindle (blade) 202 is elevated and moved to a position on the guide line 102 and starts to cut the guide line 102. In this instance, the detecting sensor 205 does not perform the detection and operation (although a precision in cutting of the cutting surface is required where a substrate is joined to another substrate on the slice line side, on the guide line side, since the substrate does not come into contact with the other substrate, a cutting precision is not required as compared with that of the slice line side). It is not always necessary to cut the guide line in accordance with a situation such as a size of the substrate or the like.

After the cutting of the guide line is finished, the spindle (blade) 202 is elevated and the stage 204 is rotated by 90°. After the stage 204 is rotated by 90°, the spindle 202 executes a matching process from the substrate center portion 1 on the second slice line. When seeing the alignment position shown in FIG. 10 as an example, the alignment position is moved in accordance with the order of 2→3→4→5, thereby gradually matching the position with the direction of the substrate edge portion in a manner similar to that above.

After completion of the matching, the cutting operation is started. While the light reflected from the second guide line is detected by the detecting sensor, the second slice line is cut. After the second slice line is cut, the spindle is moved to the position on the second guide line and starts to cut the second guide line. After completion of the cutting of the second guide line, the cutting operation is finished.

EMBODIMENT 2

The guide line also can be commonly used as a slice line. In such a case, the following processing steps are executed.

FIG. 12A shows a line in which the slice line and guide line formed on the substrate surface are shared (combined).

A common line 106 is formed by an electrode layer formed in parallel with a first or second electrode constructing a TFT or a sensor together with such an electrode or by the first or second electrode.

FIGS. 12B and 12C schematically show examples in the case where the substrate is set onto the stage of the cutting apparatus and the common line is displayed on the monitor through the CCD camera installed in the cutting line. When the alignment is not performed as shown in FIG. 12B, by moving or rotating the stage position, the front edge portion of the common line portion is matched with the scale line on the monitor so as to be aligned as shown in FIG. 12C.

After completion of the matching process, the cutting operation is started. At the same time, as shown in schematic side elevational views of FIGS. 13A and 13B, a light is irradiated to the common line from the light source 203 provided in front of the spindle. The light is reflected by the common line 106, which is a guide line, thereby confirming the cutting position by the detecting sensor. FIG. 13B is a diagram when FIG. 13A is seen from the right side in the diagram.

For example, when a misalignment of the stage occurs in the A direction, a sensor output of sensor portion (1) decreases and a sensor output of sensor portion (2) rises. Therefore, a misalignment movement quantity of the stage is calculated from a difference between those outputs and the stage is moved in the B direction and is returned to the original position.

When a misalignment of the stage occurs in the B direction, the sensor output of sensor portion (1) decreases and a sensor output of sensor portion (3) rises. Therefore, a misalignment movement quantity of the stage is calculated from a difference between those outputs and the stage is moved in the A direction and is returned to the original position.

As described above, while the first common line 106 is being cut, the light reflected from the first common line 106 is monitored by the detecting sensor.

After completion of the cutting of the first common line 106, the spindle is elevated and moved to the front edge position on a second common line 106 and starts to cut the second common line 106. In a manner similar to the cutting of the first common line 106, during the cutting operation, the light reflected from the second common line 106 is monitored by the detecting sensor.

After completion of the cutting of the second common line 106, the spindle is elevated and the stage is rotated by 90°.

After the stage was rotated by 90°, the spindle moves, and a third common line 106 is displayed on the monitor through the CCD camera. By moving and rotating the stage position, the front edge portion of the third common line 106 is matched with the scale line on the monitor. In a manner similar to the case of cutting the first common line 106, during the cutting operation, the light reflected from the third common line 106 is monitored by the detecting sensor.

After completion of the cutting of the third common line 106, the spindle is elevated and moved to the front edge position on a fourth common line 106 and starts to cut the fourth common line 106. In a manner similar to the case of cutting the first common line 106, during the cutting operation, the light reflected from the common line 106 is monitored by the detecting sensor.

EMBODIMENT 3

In the embodiment, a cutting method of a sensor array substrate in the case where a sensor array is formed in a region of (215 mm×215 mm) on a glass substrate of (300 mm×250 mm) will now be described.

Figure 14:
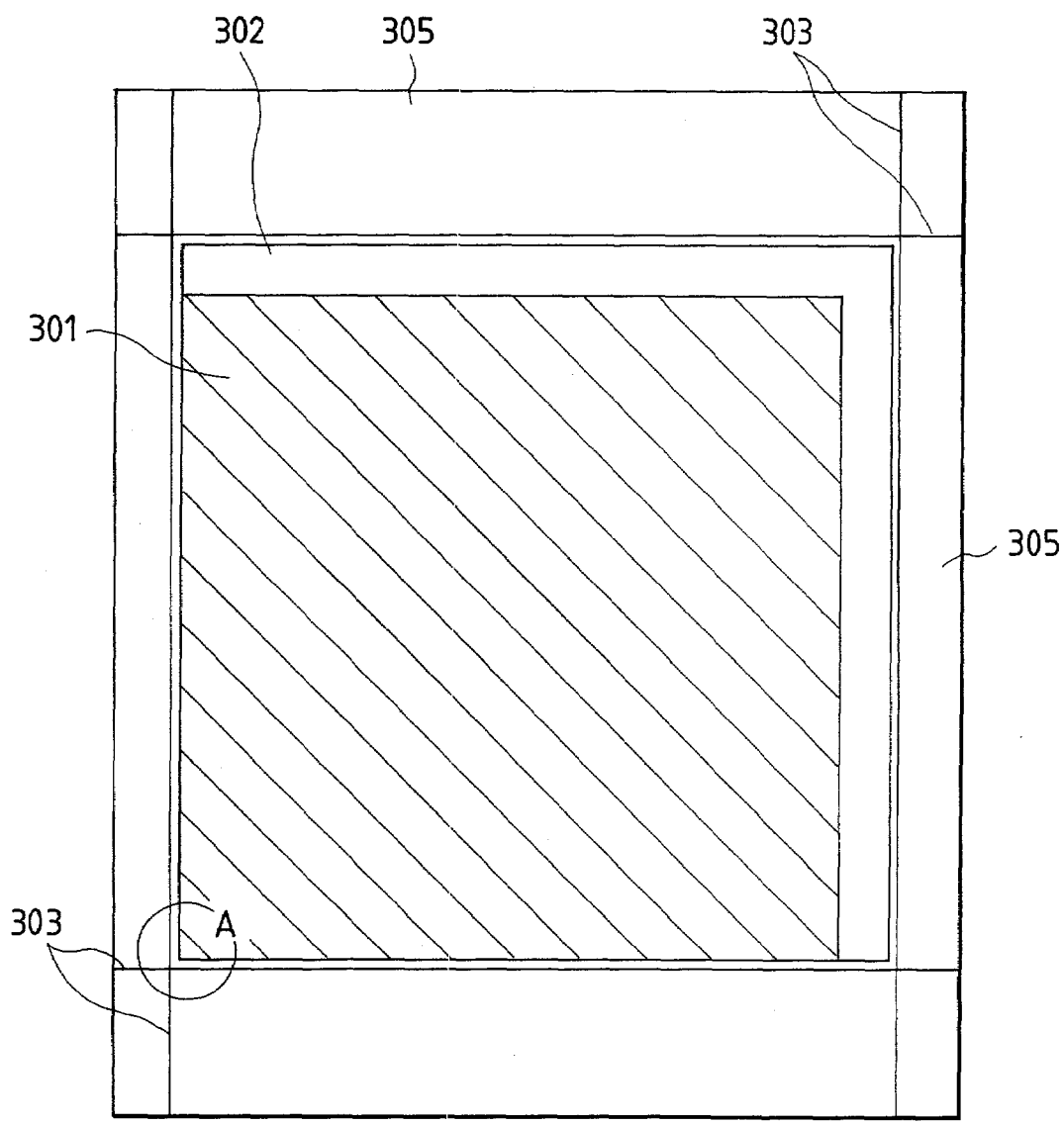
Figure 15:
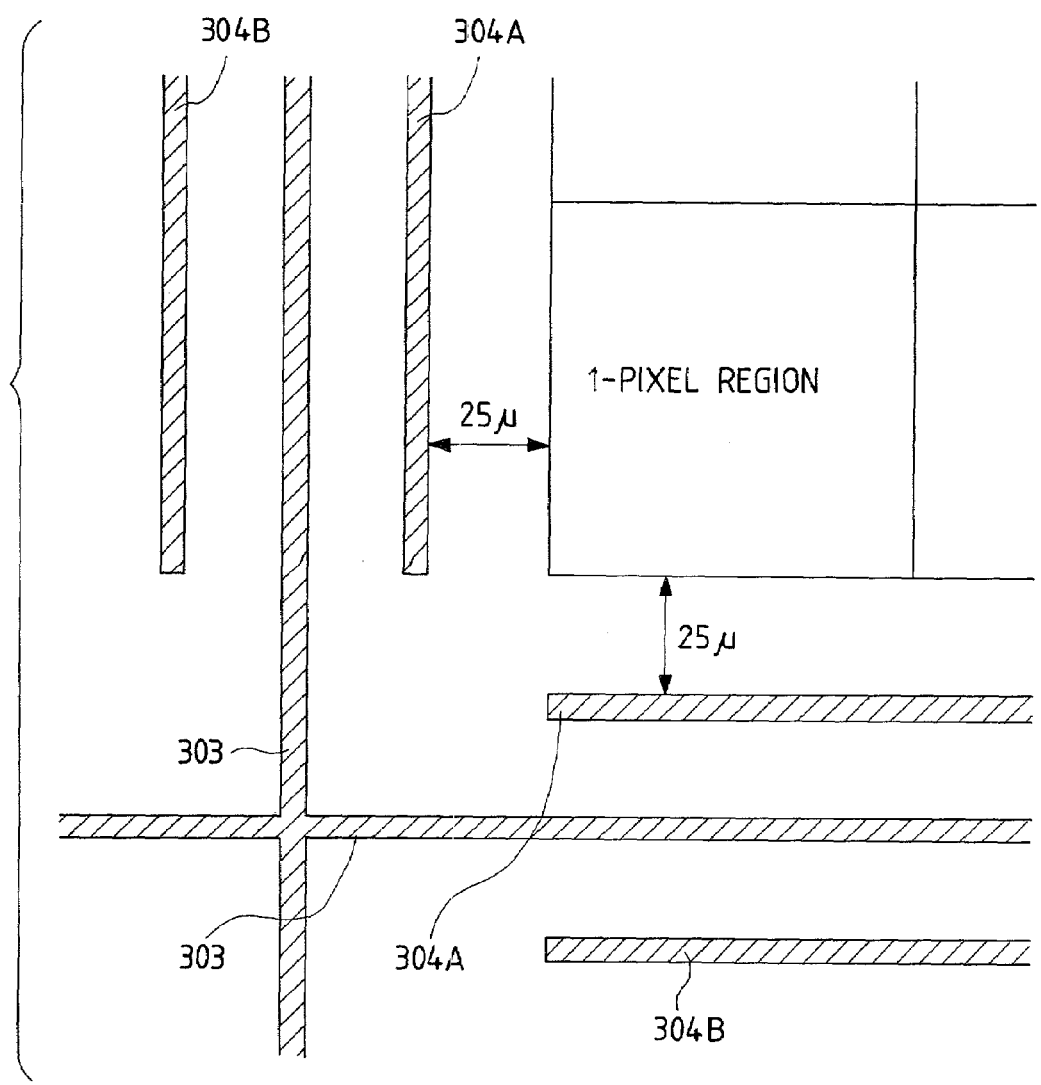

FIG. 14 shows a schematic plan view of the sensor array substrate. In the diagram, reference numeral 301 denotes a pixel region and a region of one pixel has dimensions of 160 μm×160 μm. Reference numeral 302 denotes a wiring leading portion; 303 a slice line which is commonly used as a guide line; and 305 an unnecessary portion. An enlarged diagram of an A portion in FIG. 14 is shown in FIG. 15. Reference numerals 304A and 304B denote monitor lines for confirming a cutting precision. A width of each line is set to 7 μm.

Figure 16:
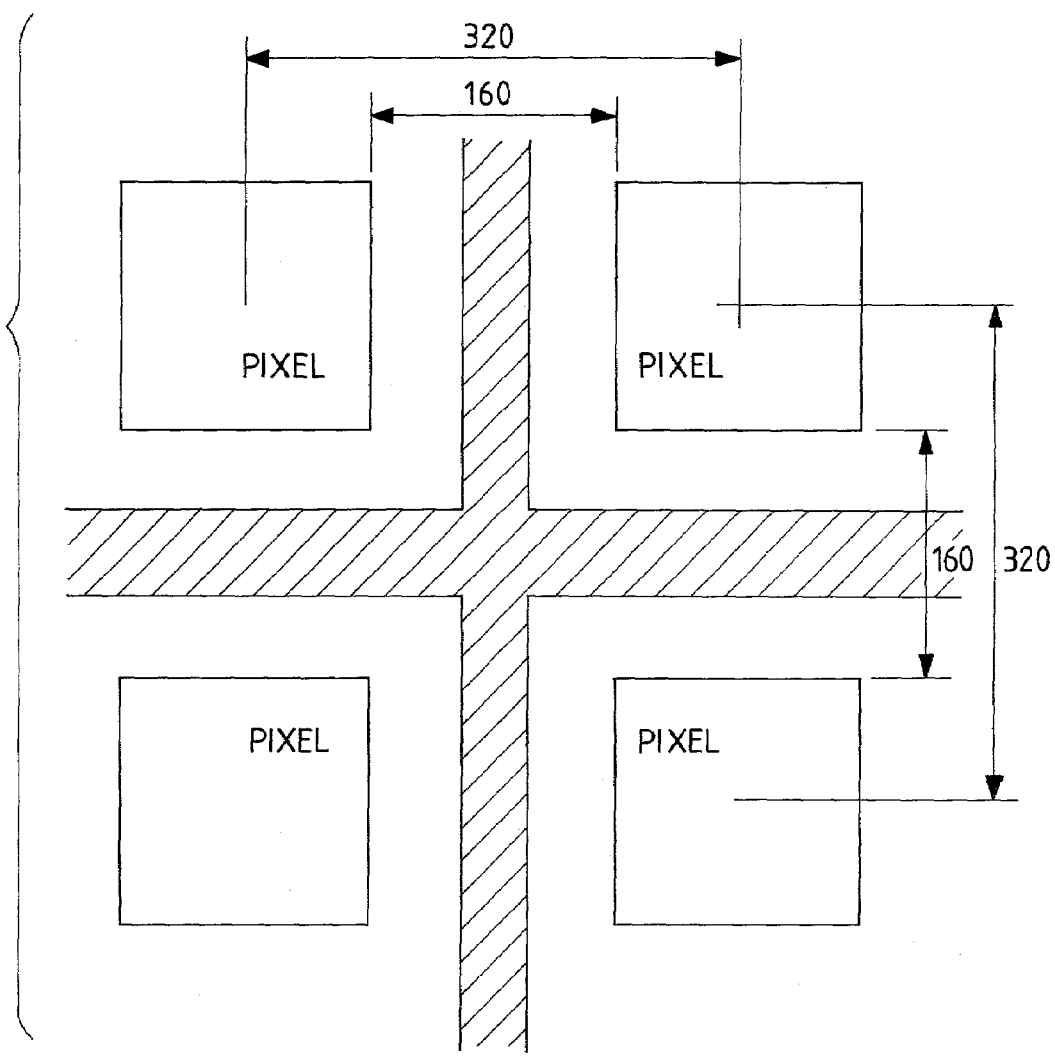

The monitor line in the embodiment is used to finally confirm the cutting at a high precision. The monitor line also can be used to detect an abnormality of the cutting apparatus. In the embodiment, the monitor lines are provided on both sides of the slice line as shown in FIG. 15. A monitor line 304A inside the slice line, namely, on the pixel side is a limit line toward the inside provided in consideration of a misalignment quantity and a chipping quantity upon cutting. In other words, it is a limit margin from a pixel at which an influence on the pixel characteristics begins. The embodiment shows a case where the margin is set to 25 μm. The cutting of the limit line denotes an occurrence of an abnormality of the apparatus or a deterioration of the blade (rotary blade) which is used upon cutting. In such a case, it is necessary to promptly take a countermeasure. On the other hand, a monitor line 304B outside of the slice line denotes a maximum misalignment quantity when considering a case where four substrates are joined in order to realize a large area. That is, when the substrate is cut in excess of the monitor line 304B, namely, when this line remains, there is a case where a gap between the adjacent substrates upon joining four substrates cannot satisfy a design value. In such a case, an apparatus abnormality is also similarly considered. As shown in FIG. 16, the gap between the adjacent substrates after four substrates are joined in the embodiment can be set to 320 µm in which one pixel is omitted from the pixel center of the corner portion of each substrate.

Figure 17:
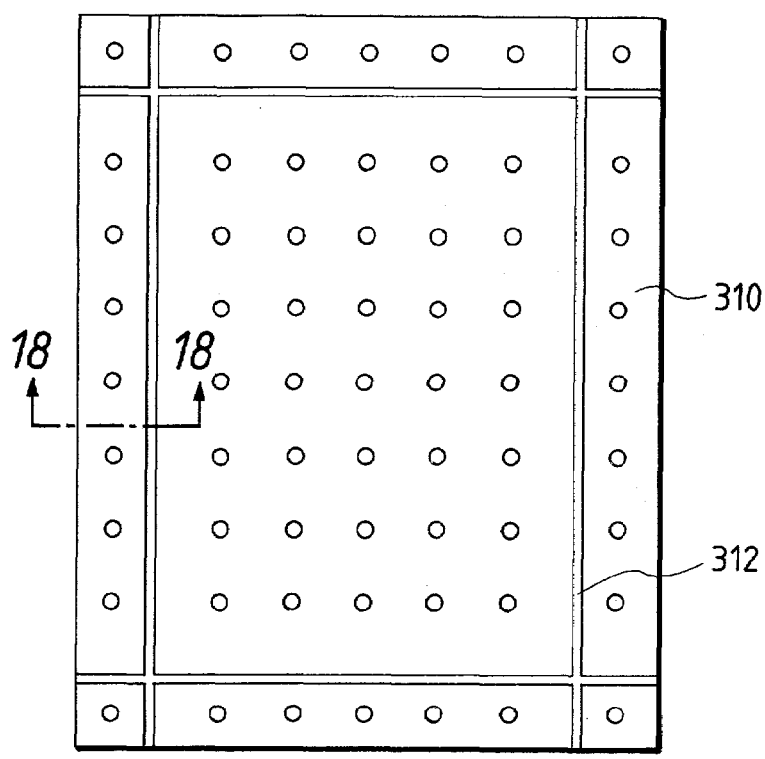
FIG. 17 is a schematic plan view showing an example of a base plate (stage) on which a member to be cut is mounted.
Figure 18:
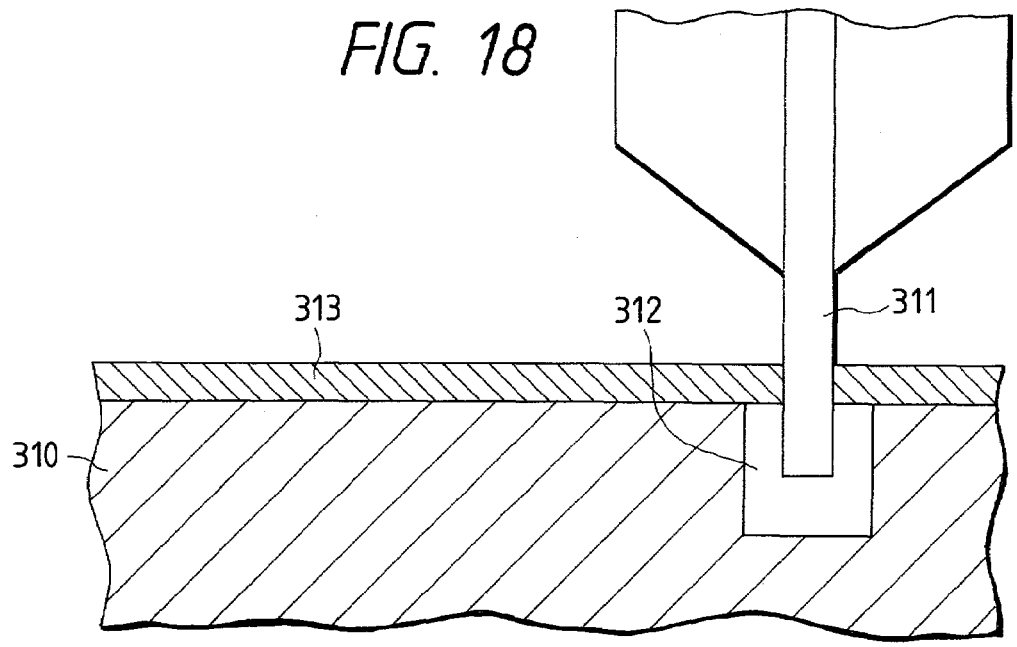
FIG. 18 is a schematic cross-sectional view for explaining a cutting state.

In the embodiment, in order to more vertically cut the cutting surface, a stage 310 in which a groove 312 having a depth of 1 mm is formed in accordance with the slice line is used. FIG. 17 shows a schematic plan view and FIG. 18 shows a cross sectional view taken along the line 18—18 in FIG. 17 (the blade is not shown in FIG. 17). A blade 311 is designed so as to perfectly cut a substrate 313 and enter the groove 312. No problem occurs when a projection tooth amount of the blade projecting under the substrate is set to a value within a range from 0.3 mm to 0.5 mm. In the embodiment, it is set to 0.5 mm.

The substrate is set onto the foregoing stage, the stage is moved while seeing the slice line on the monitor screen through the CCD camera installed in the cutting apparatus, and the front edge portion of the slice line is matched with the scale line on the monitor screen.

After completion of the matching process, the cutting operation is started. Simultaneously, the light is irradiated to the slice line from a light source arranged in front of the spindle. The light is reflected by the slice line, the cutting position is confirmed by the detecting sensor, the slice line is cut while correcting the slice misalignment quantity. After the slice line is cut, the spindle is elevated and moved to the front edge position on a next slice line and starts to cut the slice line. In a manner similar to the slice line, during the cutting operation, the light reflected from the monitor line is monitored by the detecting sensor. After the cutting of the slice line serving as a common line is finished, the spindle is elevated and the stage is rotated by 90°. After that, the remaining two slice lines are similarly cut.

After all of the slice lines are cut or, in particular, after the slice line in the substrate joining portion is cut, the presence or absence of the monitor line is confirmed. Ordinarily, the inside monitor line, namely, on the pixel side remains and the outside monitor line does not remain because it has been cut. By joining a plurality of, for example, four sensor array substrates cut in this manner, a large area and a low price can be realized.

In the embodiment, although the guide line is commonly used as a slice line also, the monitor line can be obviously commonly used as a guide line.

EMBODIMENT 4

The embodiment will now be described with respect to a cutting confirming method in case of electrically checking the monitor line used in the embodiment 3.

Figure 19:
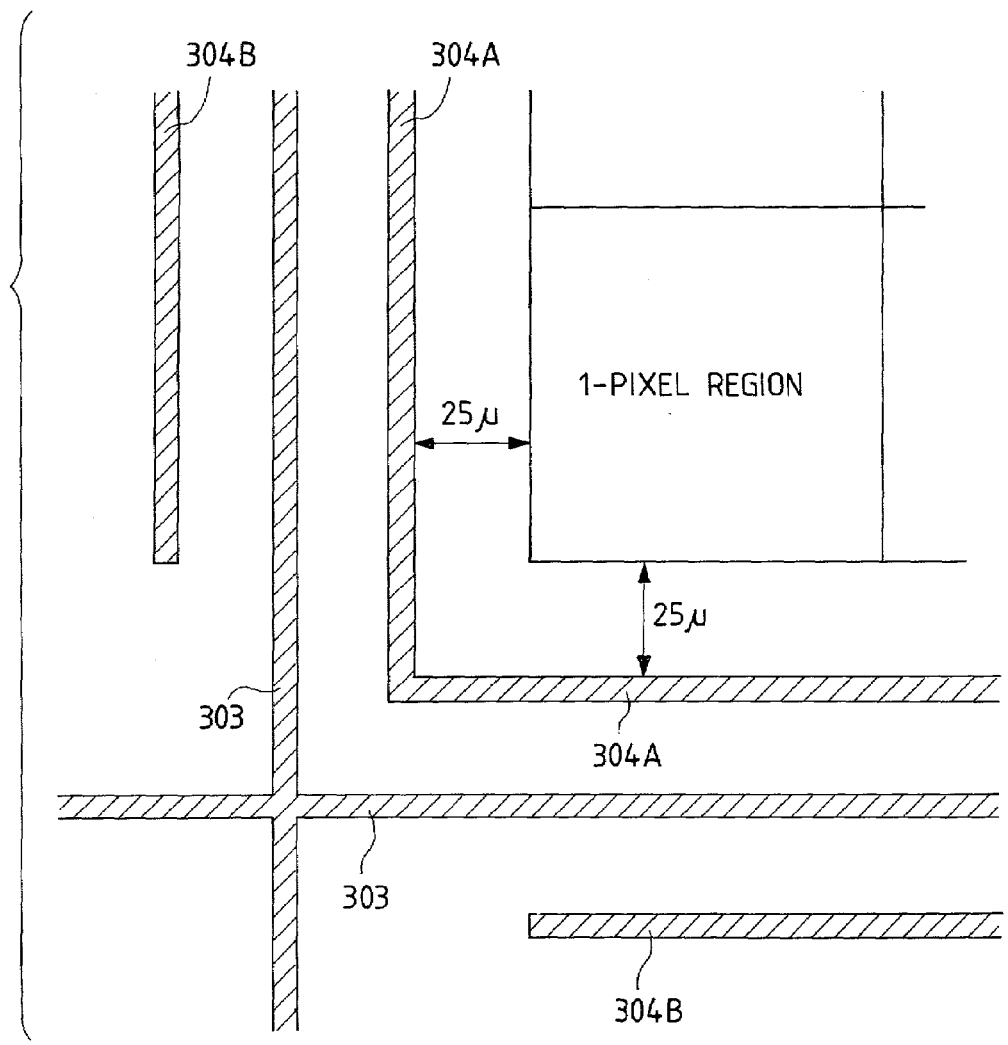

Specifically speaking, as shown in FIG. 19, the inside monitor line 304A, namely, on the pixel side, is connected and wired up to a wiring leading portion, a pad portion (not shown) is provided, and after the cutting, whether it is open or not is confirmed by a tester. Since an electrical confirmation is performed, there is an advantage such that an evaluation can be performed in a short time.

EMBODIMENT 5

The embodiment will now be described with respect to an example of a monitor line in which the embodiment 4 is further improved.

Figure 20:
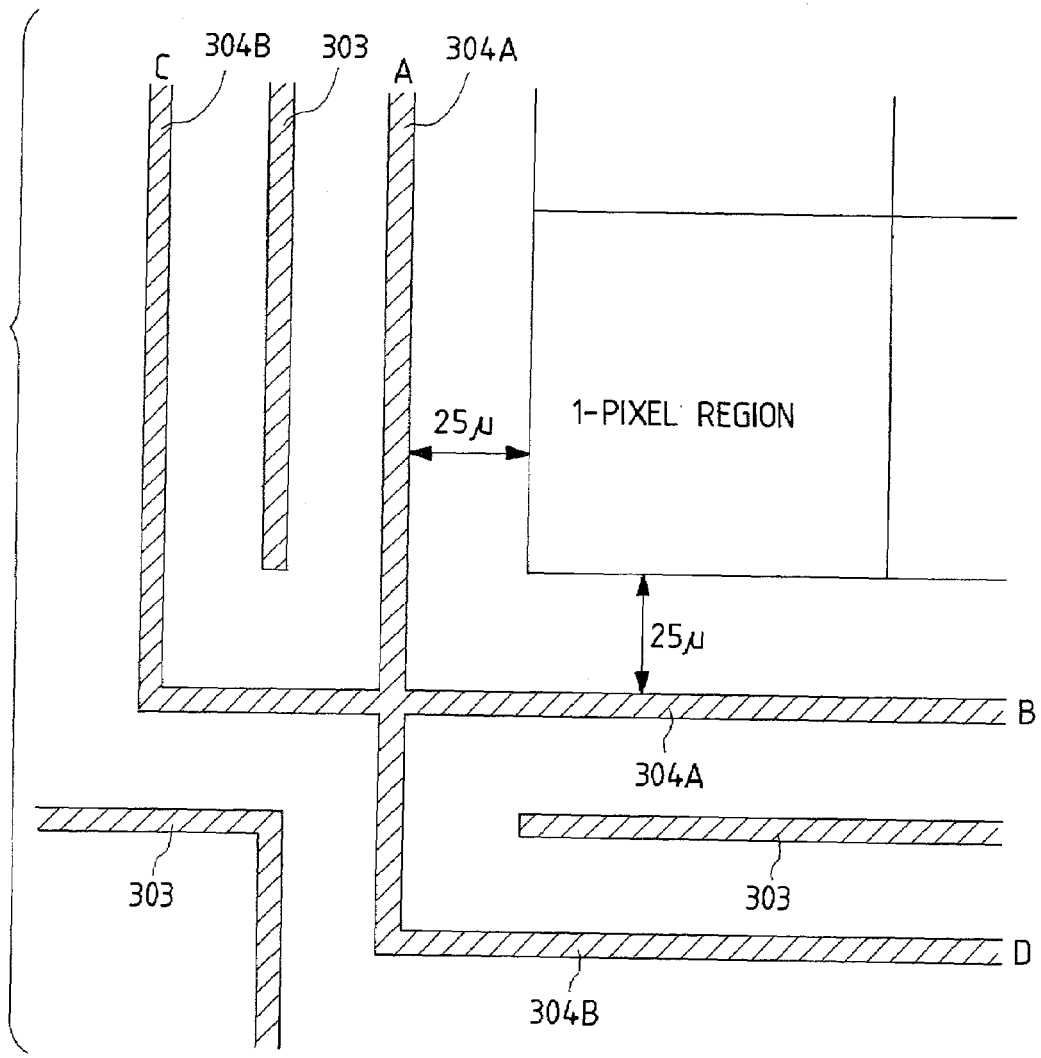

Specifically speaking, as shown in FIG. 20, a monitor line outside the slice line and a monitor line on the pixel side are connected. Each line is wired up to a wiring leading portion, a pad portion (not shown) is provided, and after the cutting, whether it is open or not is confirmed by a tester. As a confirming method, first, an open state of A-B, a short-circuit of A-C, and a short-circuit of B-D are confirmed by the tester. There is also likewise an advantage such that since the electrical confirmation is performed, an evaluation of a slice misalignment to the outside and inside, an apparatus abnormality, a deterioration of the blade, or the like can be easily performed.

As shown in the diagram, there is obviously no need to limit the portion connecting the inside and outside monitor lines to only the edge portions of the monitor lines but they also can be connected in an intermediate region. By connecting the monitor lines in the intermediate region, a cutting misalignment in only portions other than both edge portions can be more easily found out.

Figure 21:
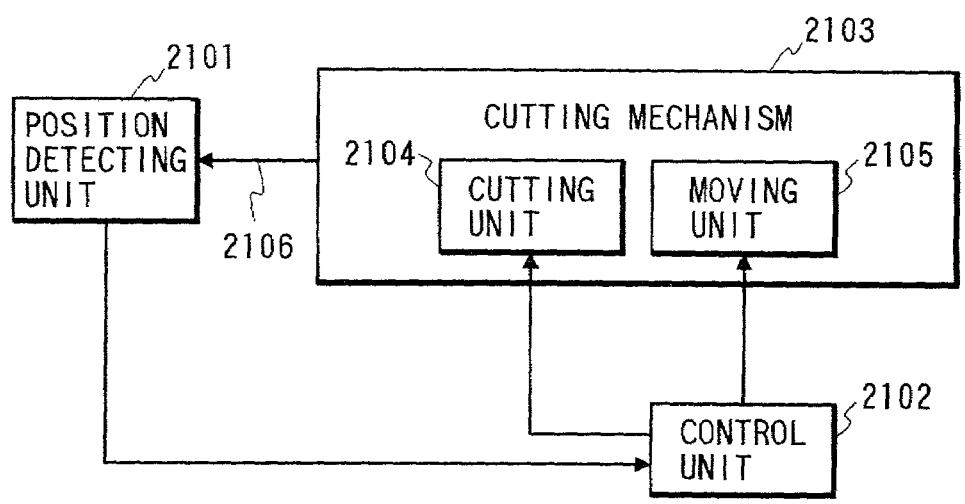
FIG. 21 is a block constructional diagram of an example of a substrate cutting apparatus.

The substrate cutting apparatus of the invention can be constructed as shown in, for example, a schematic block constructional diagram of FIG. 21.

In the diagram, information from a position detecting unit 2101 is inputted to a control unit 2102. The control unit 2102 calculates a present cutting position and generates to a moving unit 2105 an instruction for relatively moving a cutting unit 2104 such as a rotary blade, water jet nozzle, or the like for the substrate as an object to be cut as necessary. The moving unit 2105 can have an arbitrary structure and form so long as it can move at a necessary precision. For example, the moving unit can have a driving unit such as a linear motor, piezoelectric vibrator, or the like and, as necessary, a power transfer unit such as a screw-shaped member, gear, chain, or the like. As a cutting mechanism 2103, an example having the cutting unit 2104 and moving unit 2105 is shown and explained in the diagram. In the case of moving only the stage on which the substrate is mounted, however, it is not always necessary that the cutting unit 2104 constructs a part of the cutting mechanism. The cutting mechanism 2103 also can be constructed by including a part of the control unit 2105. In any one of the above constructions, the cutting position is detected in accordance with position information 2106 of the guide line and the cutting operation is executed while relatively adjusting the cutting position, so that the cutting operation is executed at a desired high precision.

According to the substrate cutting method of the invention as described above, since the side surfaces of the adjacent substrates can be accurately cut, the substrates can be joined substantially as if in a plane by eliminating a gap between the adjacent substrates or reducing the gap so as to be smaller than the current gap. Therefore, an image quality of the substrate joining portion of the photoelectric converting apparatus of a large area can be improved.

According to the invention, a yield per substrate upon manufacturing of the photoelectric converting apparatus of a large area is improved and a loss amount per substrate due to an inconvenience is reduced, so that the costs of the photoelectric converting apparatus of a large area can be reduced.

The present invention is not limited to the foregoing embodiments but many modifications and variations are possible within the spirit and scope of the appended claims of the invention.

When an accuracy of cutting is required, the invention also can be applied to a cutting of a substrate other than the cutting of the photoelectric converting apparatus of the invention.

What is claimed is:

1. A method of cutting a substrate on which two-dimensionally arranged semiconductor elements are installed, said method comprising the steps of:

detecting a guide line by detecting a guide element provided on the substrate at an area adjacent a semiconductor element;

cutting the substrate along a slice line while detecting the guide line; and automatically correcting a cutting position during cutting based on misalignment with the detected guide line.

2. The method according to claim 1, wherein the substrate is fixed on a stage, the stage having a groove corresponding to the slice line to cut the substrate.

3. The method according to claim 1, wherein the slice line comprises an electrode layer provided on the substrate.

4. The method according to claim 1, further comprising cutting the guide element after the substrate is cut along the slice line.

5. The method according to claim 1, wherein the slice line and the guide line are the same line.

6. The method according to claim 1, wherein the slice line and the guide line are parallel to one another.

7. The method according to claim 1, wherein the guide element comprises an electrode layer.

8. The method according to claim 1, further comprising electrically checking a monitor line after the cutting step is completed, the monitor line comprising an electrical conductor and provided on the substrate between the slice line and an adjacent one of the semiconductor elements.

9. The method according to claim 1, wherein the step of detecting is performed using a light source and a photoelectric converting element.

10. The method according to claim 1, wherein the step of cutting is performed using a rotary blade.

* * * * *

UNITED STATES PATENT AND TRADEMARK OFFICE
CERTIFICATE OF CORRECTION

PATENT NO. : 7,077,120 B2
APPLICATION NO. : 08/801464
DATED : July 18, 2006
INVENTOR(S) : Akira Funakoshi et al.

It is certified that error appears in the above-identified patent and that said Letters Patent is hereby corrected as shown below:

COLUMN 2:
    Line 16, "has the same" should read --have the same --.
    Line 45, "for a sensitivity as well" should read -- for sensitivity, as well, --.

COLUMN 3:
    Line 17, "as if in a plane" should read -- substantially in a plane --.

COLUMN 5
    Line 66, "specifically speaking," should read -- specifically, --.

COLUMN 6:
    Line 1, "as if" should be deleted.
    Line 46, "portion (1)" should read -- portion (2) --.
    Line 47, "portion (2)" should read -- portion (1) --.
    Line 52, "portion (1)" should read -- portion (2) --.
    Line 64, "a precision" should read -- precision --.

COLUMN 7:
    Line 1, "a cutting" should read -- cutting --.
    Line 52, "portion (1)" should read -- portion (2) --.
    Line 53, "portion (2)" should read -- portion (1) --.
    Line 59, "portion (1)" should read -- portion (2) --.

COLUMN 8:
    Line 11, "was rotated" should read -- is rotated --.
    Line 24, "common" should read -- fourth common --.

COLUMN 9:
    Line 7, "cross sectional" should read -- cross-sectional --.
    Line 48, "in case" should read -- in the case --.
    Line 50, "Specifically speaking," should read -- Specifically, --.
    Line 63, "Specifically speaking," should read -- Specifically, --.

UNITED STATES PATENT AND TRADEMARK OFFICE
CERTIFICATE OF CORRECTION

PATENT NO. : 7,077,120 B2
APPLICATION NO. : 08/801464
DATED : July 18, 2006
INVENTOR(S) : Akira Funakoshi et al.

It is certified that error appears in the above-identified patent and that said Letters Patent is hereby corrected as shown below:

COLUMN 10:
Line 45, "as if" should be deleted.
Line 60, "an accuracy" should read -- accuracy --.

Signed and Sealed this

Second Day of January, 2007

JON W. DUDAS
*Director of the United States Patent and Trademark Office*